United States Patent
Bernstein et al.

(10) Patent No.: US 7,253,072 B2
(45) Date of Patent: Aug. 7, 2007

(54) IMPLANT OPTIMIZATION SCHEME

(75) Inventors: James D. Bernstein, Plano, TX (US); Lance S. Robertson, Rockwall, TX (US); Said Ghneim, Richardson, TX (US); Nandu Mahalingam, Richardson, TX (US); Benjamin Moser, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 365 days.

(21) Appl. No.: 11/006,257

(22) Filed: Dec. 7, 2004

(65) Prior Publication Data

US 2005/0255683 A1 Nov. 17, 2005

Related U.S. Application Data

(60) Provisional application No. 60/571,669, filed on May 13, 2004.

(51) Int. Cl.
*H01L 21/331* (2006.01)
(52) U.S. Cl. ............... 438/372; 438/373; 438/302; 438/369; 438/370; 438/506; 438/514; 438/519
(58) Field of Classification Search ............... 438/372, 438/373, 302, 369, 370, 506, 514, 519
See application file for complete search history.

(56) References Cited

U.S. PATENT DOCUMENTS

2003/0155533 A1* 8/2003 Iwasawa et al. ....... 250/492.21
2004/0099818 A1* 5/2004 Jun et al. ............... 250/492.21
2004/0137687 A1* 7/2004 Feudel et al. ............... 438/302
2004/0232350 A1* 11/2004 Iwasawa et al. ........ 250/396 R
2006/0001109 A1* 1/2006 Shaheen et al. ............ 257/401

OTHER PUBLICATIONS

Kenji Yoneda, et al.; "The Drain Current Asymmetry of 130nm MOSFETs due to Extension Implant Shadowing Originated by Mechanical Angle Error in High Current Implanter"; Extended Abstracts of the Third International Workshop on Junction Technology, Dec. 2-3, 2002, pp. 19-22.
S.R. Walther, et al.; "Dopant Channeling as a Function of Implant Angle for Low Energy Application"; 1999 IEEE; pp. 126-129.
Lenoard M. Rubin, et al.; "Process Control Issues for Retrograde Well Implants for narrow n+/p+ Isolation in CMOS"; Proc. of the XIV Int'l Conf. on Ion Implantation Technology, Taos, NM, 2002, pp. 17-20.

* cited by examiner

*Primary Examiner*—Thao P. Le
(74) *Attorney, Agent, or Firm*—Peter K. McLarty; W. James Brady, III; Frederick J. Telecky, Jr.

(57) ABSTRACT

The present invention provides a method for implanting ions in a substrate and a method for manufacturing an integrated circuit. The method for implanting ions in a substrate, among other steps, including placing a substrate (410) on an implant platen (405) such that a predominant axes (430) of the substrate (410) is rotated about 30 degrees to about 60 degrees or about 120 degrees to about 150 degrees offset from a radial with respect to the implant platen (405), and further wherein the substrate (410) is not tilted. The method further includes implanting ions into the substrate (410), the rotated position of the predominant axes (430) reducing shadowing.

22 Claims, 5 Drawing Sheets

IMPLANT OPTIMIZATION SCHEME

CROSS-REFERENCE TO PROVISIONAL APPLICATION

This application claims the benefit of U.S. Provisional Application No. 60/571,669 entitled "IMPLANT ROTATION ANGLE OPTIMIZATION FOR IMPROVED TRANSISTOR SYMMETRY," to James D. Bernstein, et al., filed on May 13, 2004, which is commonly assigned with the present invention and incorporated herein by reference as if reproduced herein in its entirety.

TECHNICAL FIELD OF THE INVENTION

The present invention is directed, in general, to an implant optimization scheme and, more specifically, to an implant optimization scheme wherein predominant axes of an implantable substrate are chordal with respect to an implant platen.

BACKGROUND OF THE INVENTION

Advanced integrated circuit design requires precise control of beam incidence angles. While a number of different types of beam incidence angle error exist, three of the more common types are cone angle error, beam steering error and parallelism error across the wafer. Cone angle error is typically a result of cone angle effects caused by the geometry of the wafer scanning system. Cone angle error causes within wafer variation. For example the beam angle error may be about −x degrees at one edge of the wafer, be approximately zero degrees as the center of the wafer, and be about +x degrees at the opposing edge of the wafer.

Steering error, on the other hand, tends to be a fixed error across the wafer that is introduced while tuning the beam between lots, implant batches, or whenever the tuning may occur. The parallelism error, for whatever reason, leads to random beam incidence angle errors across the width of the wafer. This error is particularly difficult to correct as a result of its random nature.

Unfortunately, without precise control of beam incidence angles, various different problems degrade the transistors of the integrated circuit. As an example, transistor asymmetry, variation, and depressed MPY often result due to beam incidence angle error. The beam incidence angle error also typically leads to gate shadowing and an asymmetric dopant distribution, both of which are undesirable.

Turning to FIGS. 1A and 1B, illustrated is an example of an implant system 100 that could lead to gate shadowing on a transistor device. The implant system 100 illustrated in FIG. 1A includes one or more substrates 110 located on or over an implant platen 105. As is illustrated, a predominant axis of each of the substrates 110 is radial with respect to the implant platen 105. The radial nature of the substrates 105 in the example shown is accomplished by aligning an alignment feature 120 of the implant platen 105 with alignment features 125 on each of the substrates 110, the alignment features 125 on each of the substrates 110 aligned with a predominant axis of each of the substrates 110. The alignment features 120, 125, as one would expect, allow the substrates 110 to be easily positioned and aligned during an implant process.

Each of the substrates 110 theoretically have one or more transistor devices 140 located thereon that are being subjected to an implant process 130 as the implant platen 105 rotates. The transistor device 140 illustrated in FIG. 1B includes a gate structure 150, having a height (h), located over the substrates 110. The transistor device 140 illustrated in FIG. 1B is being subjected to the implant process 130 to form implant regions 160. As is illustrated, the combination of the implant beam incidence angle ($\theta$) and gate structure 150 height (h) causes the implant regions 160 located within the substrates 110 not be placed equidistance from the gate structure 150. For example, one of the implant regions 160 is located a distance (d) from the sidewall of the gate structure 120, where the other implant region 160 is located adjacent the sidewall of the gate structure 150. While the distance (d) can be estimated using the equation $d = h \tan(\theta)$, it nevertheless creates an undoped/underdoped region 170 defined by the distance (d) that often tends to cause serious operational problems for the transistor device 140.

Accordingly, what is needed in the art is a method for implanting dopants within a substrate that does not experience the drawbacks of the prior art methods and devices.

SUMMARY OF THE INVENTION

To address the above-discussed deficiencies of the prior art, the present invention provides a method for implanting ions in a substrate and a method for manufacturing an integrated circuit. The method for implanting ions in a substrate, among other steps, including placing a substrate on an implant platen such that a predominant axes of the substrate is rotated about 30 degrees to about 60 degrees or about 120 degrees to about 150 degrees offset from a radial with respect to the implant platen, and further wherein the substrate is not tilted. The method further includes implanting ions into the substrate, the rotated position of the predominant axes reducing shadowing. The method for manufacturing an integrated circuit, on the other hand, additionally includes forming interconnects within dielectric layers located over microelectronic device features located over or on the substrate to form an operational integrated circuit.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the microelectronic industry, various features are not drawn to scale. In fact, the dimensions of the various features may be arbitrarily increased or reduced for clarity of discussion. Reference is now made to the following descriptions taken in conjunction with the accompanying drawings, in which.

Prior Art

DETAILED DESCRIPTION

For the purpose of completeness, a few terms need to be clarified prior to getting into the details of the present invention. For example, the term chord or chordal as used herein is intended to mean a straight line joining any two points on a perimeter of an implant platen, except for a straight line that intersects a center point of the implant platen. Where the implant platen is circular, the term chord or chordal means any straight line joining any two points on the perimeter of the circular implant platen that does not intersect a center point of the circular implant platen, and thereby define the diameter of the circular implant platen. On the other hand, where the implant platen is a polygon, the term chord or chordal means any straight line adjoining any two points on the perimeter of the polygon that does not intersect the center point of the polygon.

The term predominant axes, as used herein, may be defined using the substrates themselves or the features thereon. Often, the substrates have streets on them delineating different dies on the wafer. In this instance, the predominant axes could be substantially defined by the axes created by the orientation of the majority of the streets, taken through a center point of the substrate. Other times, streets may or may not exist and the orientation of the features on the substrate could substantially define the orientation of the predominant axes of the substrate. In this instance, the predominant axes could be defined by the axes created by the orientation of the majority of the features, taken through a center point of the substrate. Most times, the predominant axes created by the majority of the streets and the majority of the features, are substantially the same. Often, the predominant axes created by either of the streets or the features are orthogonal to one another, however, this need not always be the instance.

The term rotation angle ($\omega$), as used herein, means an angle of rotation of a predominant axis away from a radial with respect to the implant platen. For instance, if a predominant axis were pointed directly to a center point of the implant platen, as it is in the prior art, the rotation angle ($\omega$) would be zero, and thus the predominant axis would be non-chordal, as defined.

Low energy, as used herein, refers to a beam of charged particles having an energy of about 20 KeV or less. In an exemplary embodiment, however, the beam of charged particles has an energy of about 15 KeV or less, or even more advantageously of about 8 KeV or less. It goes without saying, however, that other low energy beams of charged particles could be used without departing from the scope of the present invention.

Figure 1A:
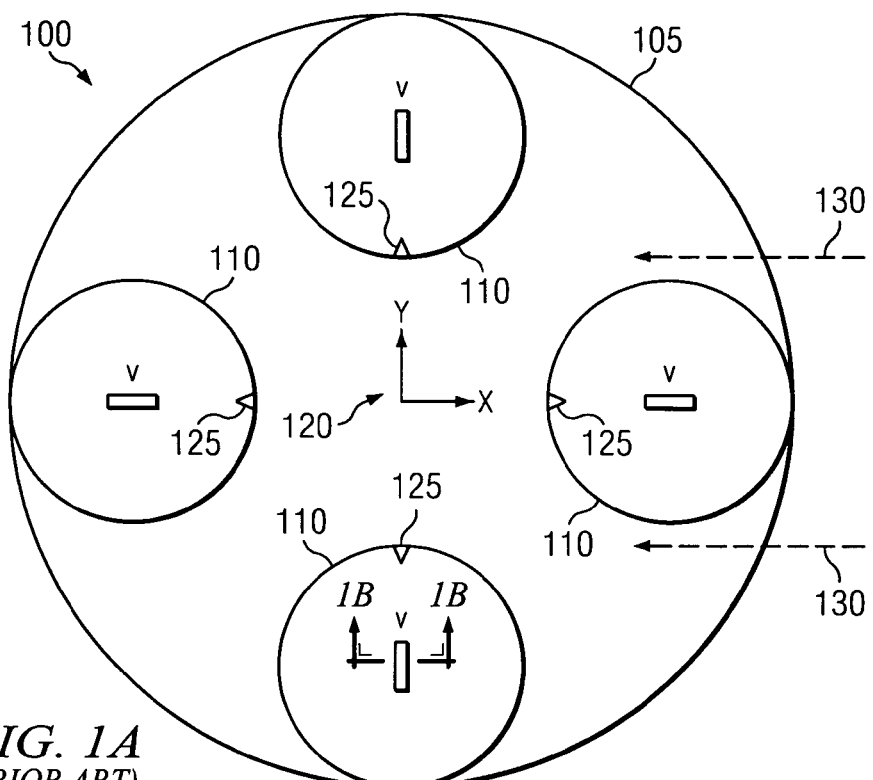
FIGS. 1A and 1B illustrate an example of an implant system that could lead to gate shadowing on a conventional transistor device.
Figure 1B:
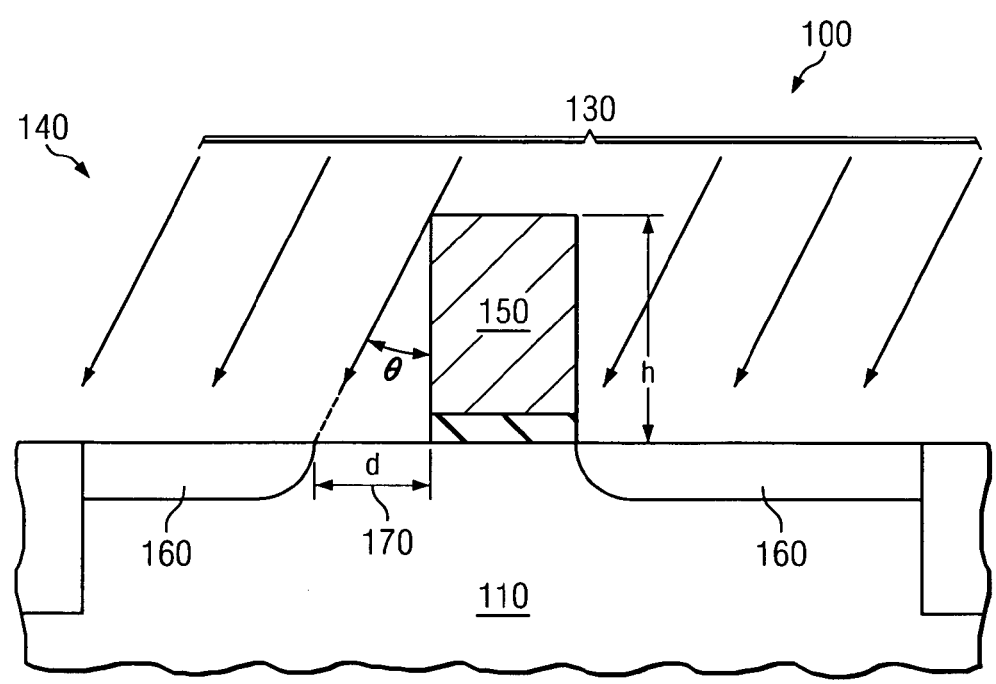
Figure 2A:
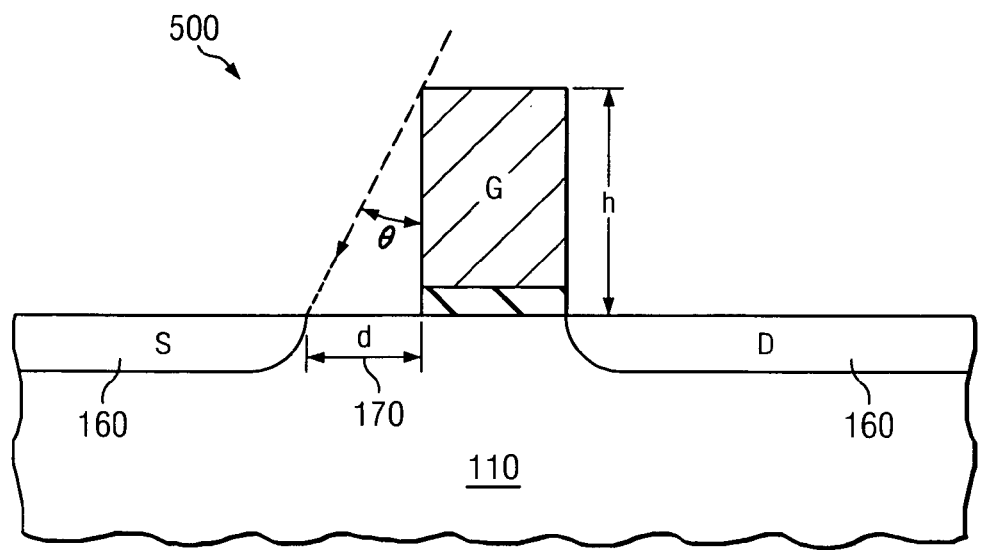
FIGS. 2A and 2B illustrate a cross-sectional view and top-down view, respectively, of a device illustrating the shadowing distance (d) and reduced shadowing distance (d')
Figure 2B:
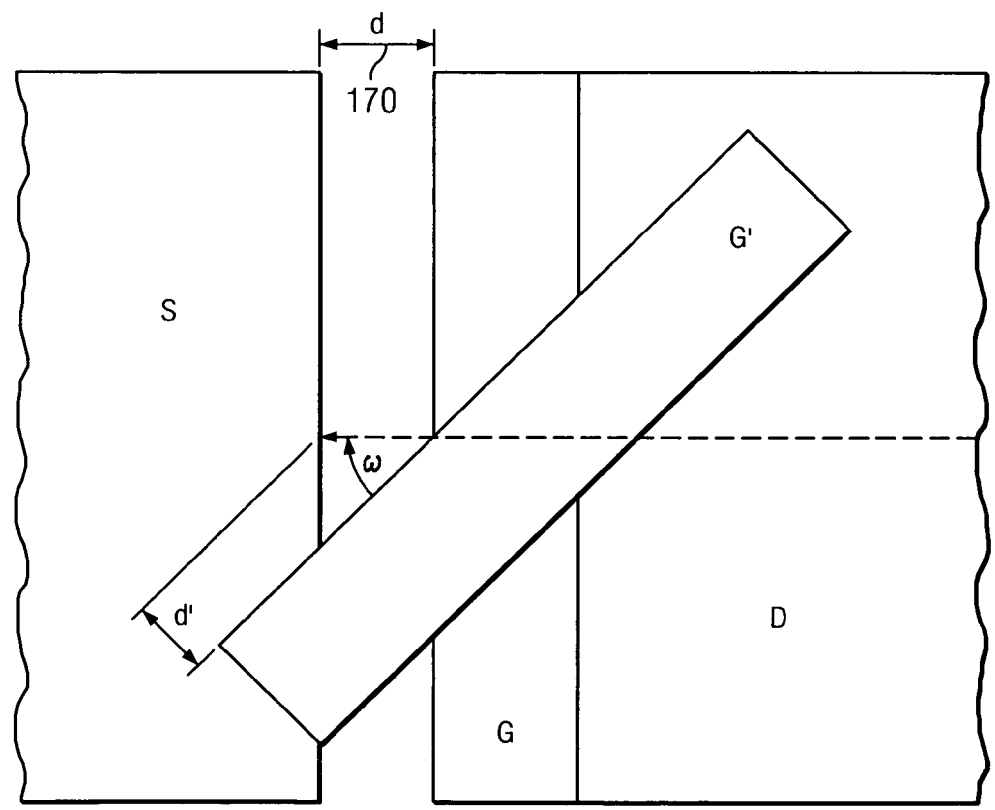

Given the aforementioned definitions, as shown in FIGS. 2A (cross-sectional view) and 2B (top-down view), the present invention is based in part on the unique recognition that for a fixed implant angle error ($\theta$), a shadowing distance (d) created during the implanting of traditional implant regions into a substrate may be reduced to a distance (d') by simply rotating the substrate such that the predominant axes of the substrate are chordal with respect to the implant platen. Traditional implant techniques, often using alignment marks on the substrate and the implant platen, aligned one of the predominant axes of the substrate to be radial with respect to the implant platen. This configuration causes the shadowing distance (d), which can be calculated using the equation $d=h*\tan(\theta)$, where (h) is the height of the gate structure and ($\theta$) is an angle between a line drawn perpendicular to the implant platen and the incidence implant source, to be significant. Simply by rotating the substrate by an angle ($\omega$) away from a radial with respect to the implant platen, such that the predominant axes of the substrate are chordal with respect to the implant platen, the traditional shadowing distance (d) can be reduced to a distance (d'). In the example given, the reduced distance (d') may be measured using the equations $d'=h*\tan(\theta)\sin(\omega)$ or $d'=d*\sin(\omega)$. These equations assume that all of the angle error ($\theta$) is in the direction of d when $\omega=0$ (i.e., there is no component of angle error into or out of the page). This is a valid approximation since the beam angle error occurs in the dispersive plane of the magnet, and that plane is fixed. If the dispersive plane of the magnet is orthogonal then the same equation would apply to a transistor oriented orthogonally from the one in FIGS. 2A and 2B. Thus, depending on the angle of rotation ($\omega$), the reduced distance (d') can be up to about 29 percent less than the traditional shadowing distance (d).

Figure 3:
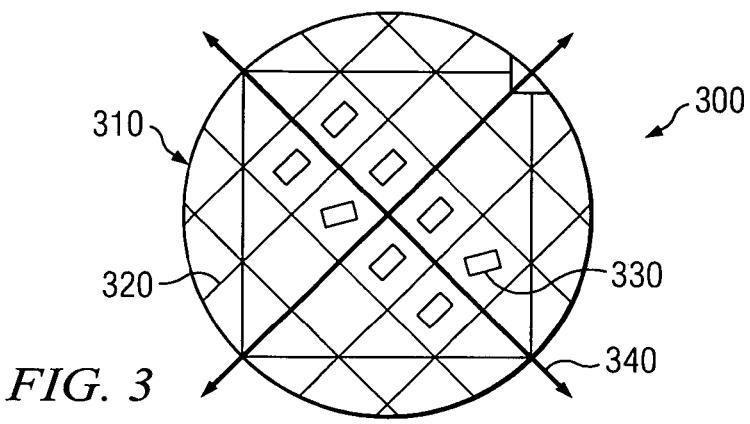
FIG. 3 illustrates an explosion plan view of an embodiment of a substrate that might be used in an implant system to accomplish the unique aspects of the present invention.

Turning now to FIG. 3, illustrated is an explosion plan view 300 of an embodiment of a substrate 310 that might be used in an implant system to accomplish the unique aspects of the present invention. The substrate 310 illustrated in FIG. 3 has a plurality of both streets 320 and features 330 located thereon. Either one or both of the plurality of streets 320 or features 330 could be used to determine the predominant axes of the substrate 310 of FIG. 3. It goes without saying that certain embodiments may exist where the substrate 310 illustrated in FIG. 3 contains no streets 320. In this embodiment, the features 330 alone would be used to determine the predominant axes of the substrate 310.

In determining the predominant axes of the substrate 310 using the streets 320, one skilled in the art would look at an orientation of the majority of the streets 320, and would then project that orientation through a center point of the substrate 310. The substrate 310 illustrated in FIG. 3 contains a plurality of streets 320. While a majority of the streets 320 are positioned in a grid-like manner, a few of the streets 320 are abnormal to the majority. Nevertheless, the orientation of the majority of the streets 320 would define the orientation of the predominant axes. Thus, after determining the orientation of the predominant axes, that orientation would be projected through a center point of the substrate 310, thus providing the predominant axes 340.

On the other hand, in determining the predominant axes using the features 330, one skilled in the art would look at an orientation of the majority of the features 330, and would then project that orientation through a center point of the substrate 310. The substrate 310 illustrated in FIG. 3 contains a plurality of features 330, many of which have the same orientation, but some of which are abnormal to the majority. Nevertheless, the orientation of the majority of the features 330 would define the orientation of the predominant axes. Thus, after determining the orientation of the predominant axes, that orientation would be projected through a center point of the substrate 310, thus providing the predominant axes 340.

Interestingly, in the embodiment discussed with respect to FIG. 3, the streets 320 and features 330 provide substantially the same predominant axes 340. It is believed that this is often the case, as placement of the features 330 define the position of the streets 320, or vice-versa. Nevertheless, certain instances may exist where the streets 320 and features 330 do not provide the same predominant axes 340. In this instance, it is believed that the features 330 should define the predominant axes 340.

Figure 4:
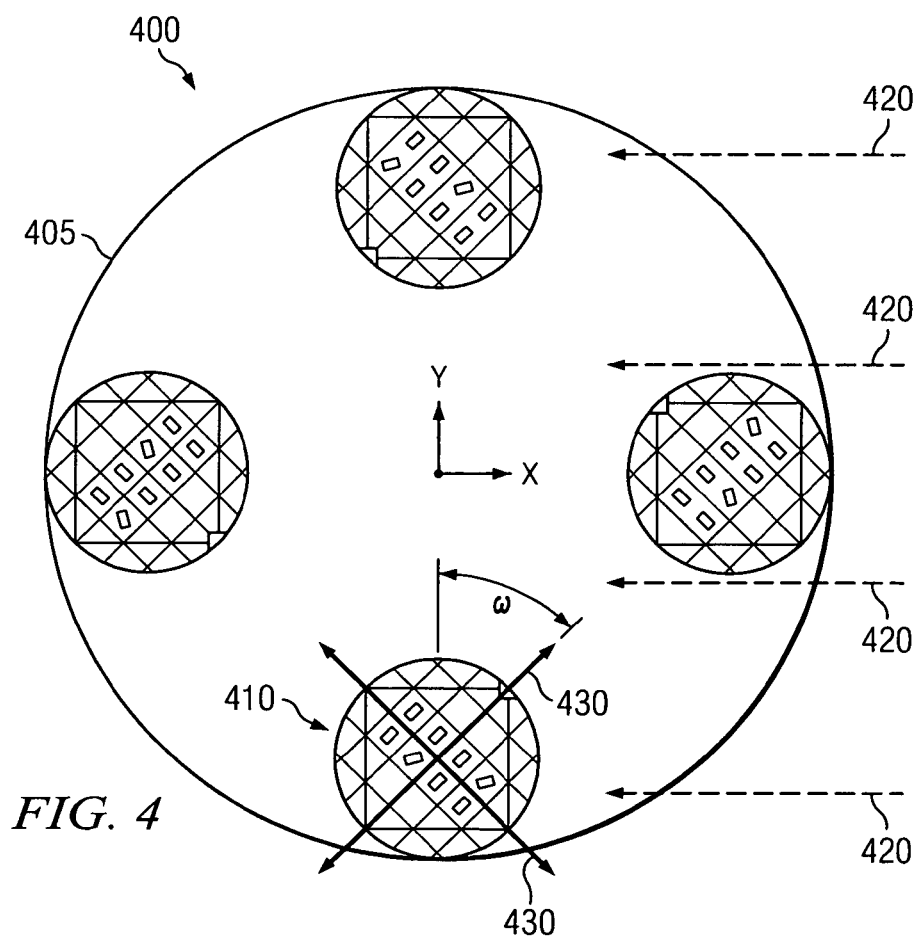
FIG. 4 illustrates a plan view of an embodiment of an implant system that might be used in an exemplary embodiment to implant ions, such as a dopant, within a substrate in accordance with the principles of the present invention.

Turning now to FIG. 4, illustrated is a plan view of an embodiment of an implant system 400 that might be used in an exemplary embodiment to implant ions, such as a dopant, within a substrate in accordance with the principles of the present invention. The implant system 400 illustrated in FIG. 4 includes a plurality of substrates 410 located on or over an implant platen 405 as they are being subjected to an implant source 420, such as a low energy beam of charged particles. The substrates 410 may be similar to the substrate 310 illustrated and discussed with respect to FIG. 3 above. For clarification, the plan view is a snapshot of the implant platen 405 and substrates 410 as they rotate about a center point of the implant platen 405. As those skilled in the art are aware, the implant platen 405 in the embodiment of FIG. 4 typically rotates in a clockwise or counterclockwise direction at a high rate of speed as the implant source 420 slowly scans across the implant platen 405 from side to side. In the embodiment shown, the substrates 410 are not tilted with respect to the implant platen 405.

The embodiment of FIG. 4 illustrates that only four substrates 410 are located on or over the implant platen 405. In actuality, any number of substrates 410, for example from one substrate 410 to an infinite number of substrates 410, could be located on or over the implant platen 405. Additionally, while the implant platen 405 is illustrated in FIG. 4 as a disk, those having skill in the art appreciate that the shape of the implant platen 405, design of the implant platen 405, and for that matter the design of the implant system 400 itself, may vary widely while staying within the scope of the present invention. Likewise, the present invention is applicable with single-wafer implanters that do not use disks or wheels.

While each of the substrates 410 in the embodiment of FIG. 4 only have vertical transistors, those skilled in the art understand that it is within the scope of the present invention for the substrates 410 to have both vertical (v) and horizontal (h) transistors. This is often the case in current integrated circuits, especially in view of the apparent need to save wafer real-estate. Nevertheless, the inventive aspects of the present invention are applicable to those situations where only vertical (v), only horizontal (h), or both vertical (v) and horizontal (h) transistors exist.

As required by the present invention, the substrates 410 are positioned such that their predominant axes 430 are chordal with respect to the implant platen 405. In the embodiment illustrated in FIG. 4, one of the predominant axes 430 of the substrates 410 is offset from a radial with respect to the implant platen 405 by a rotation angle (ω). In reality, the rotation angle (ω) may be almost any angle except for 0 degrees, 90 degrees, 180 degrees or 270 degrees. In one advantageous embodiment the rotation angle (ω) of one of the predominant axes 430 is about 15 degrees to about 75 degrees, about 105 degrees to about 165 degrees, about 195 degrees to about 255 degrees, or about 285 degrees to about 345 degrees from the radial with respect to the implant platen 405. Assuming the predominant axes 430 of the substrates 410 are orthogonal to one another, the other of the predominant axes 430 would be about 105 degrees to about 165 degrees, about 195 degrees to about 255 degrees, about 285 degrees to about 345 degrees, or about 15 degrees to about 75 degrees, respectively, from the radial with respect to the implant platen 405. In an exemplary embodiment, one of the predominant axes 430 is about 45, about 135 degrees, about 225 degrees, or about 315 degrees from the radial with respect to the implant platen 405. Assuming again that the predominant axes 430 are orthogonal, the other of the predominant axes 430 would be about 135 degrees, about 225 degrees, about 315 degrees or about 45 degrees, respectively, from the radial with respect to the implant platen 405. It is believed that this embodiment provides the best results, thereby providing the smallest distance (d') for a given angle error (θ). In the embodiment illustrated in FIG. 4 it is shown that the substrates 410 are rotated clockwise from a radial position. Nevertheless, those skilled in the art would appreciate that the substrates 410 may also easily be rotated counterclockwise and stay within the scope of the present invention.

One embodiment of the invention has the substrates 410 having alignment lines thereon to allow the predominant axes 430 to be easily found. For example, the alignment lines may be placed such that they are aligned with one of the predominant axes 430, and thus the alignment lines are also chordal with respect to the implant platen 405. Another embodiment of the invention has the alignment lines placed such that they are not aligned with one of the predominant axes 430. In this embodiment, the alignment lines might be configured so that they are radial with respect to the implant platen 405, while the predominant axes 430 are chordal with respect to the implant platen 405. This embodiment would allow for easy placement of the substrates 410 such that they are chordal with respect to the implant platen 405.

The embodiment of FIG. 4 illustrates that the substrates 410 are implanted with a full implant dose after they have been placed on the implant platen 405 such that their predominant axes 430 are chordal with respect to the implant platen 405. This represents but one embodiment covered by the present invention. Another embodiment has the substrates 410 positioned in a first position similar to that illustrated in FIG. 4, but only ¼ of a total implant dose is implanted at this time. The substrates 410 would then be rotated in the same direction by about 90 degrees to a second position and would be subjected to another ¼ of the total implant dose. The substrates 410 would then be rotated in the same direction by about 90 degrees to a third position and would be subjected to another ¼ of the total implant dose. And finally, the substrates 410 would then be rotated in the same direction by about 90 degrees to a fourth position and would be subjected to the last ¼ of the total implant dose. This embodiment provides exemplary coverage for the implant dose. A similar situation could occur where only ½ of the implant dose in implanted in two different steps, as well as any other conceivable configuration.

Figure 5:
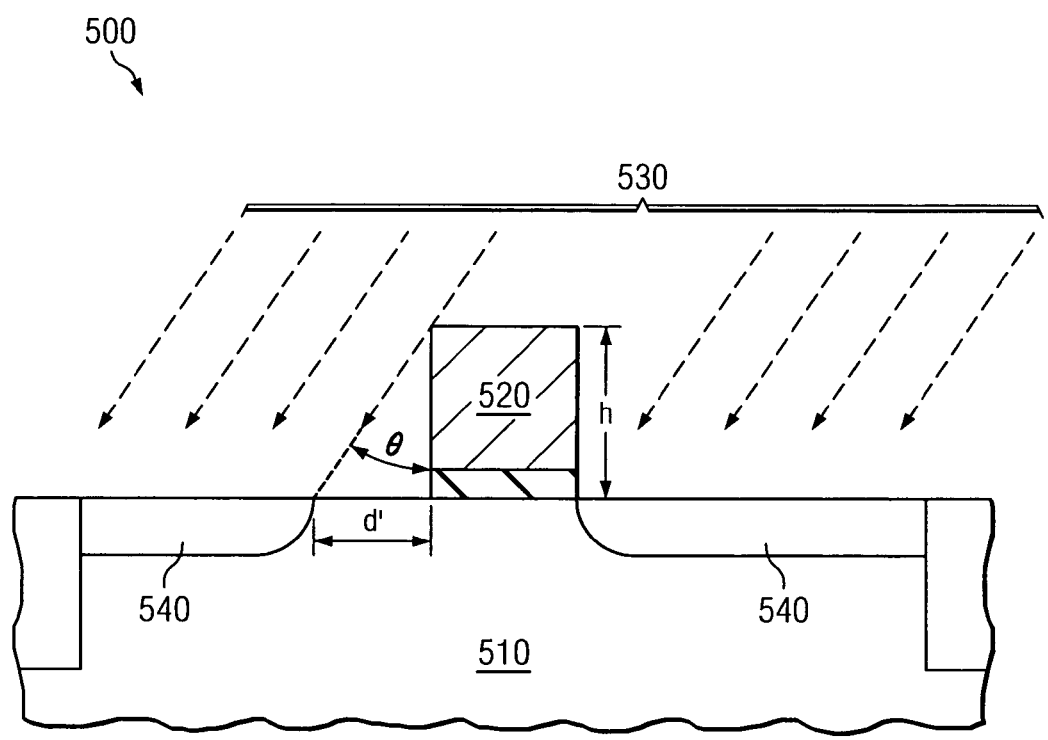
FIG. 5 illustrates a cross-sectional view of a transistor device that might be located on one of the substrates illustrated in FIG. 4.

Turning finally to FIG. 5, illustrated is a cross-sectional view of a transistor device 500 that might be located on one of the substrates illustrated in FIG. 4. The transistor device 500 illustrated in FIG. 5 includes a gate structure 520, having a height (h), located over the substrates 510. The transistor device 500 illustrated in FIG. 5 is being subjected to the implant process 530 to form implant regions 540. As is illustrated, the combination of the implant beam incidence angle (θ) and gate structure 520 height (h) causes the implant regions 540 located within the substrates 510 not be placed equidistance from the gate structure 520. For example, one of the implant regions 540 is located a distance (d') from the sidewall of the gate structure 520, where the other implant region 540 is located adjacent the sidewall of the gate structure 520.

Unique to the present invention, the distance (d') is significantly less than the distance (d) that would be obtained for the same incidence angle (θ) and gate structure height (h) for a similar transistor device in prior art structures. The reduced distance (d') may be attributed to the positioning of the substrates such that predominant axes of the substrates are chordal with respect to the implant platen.

Advantageously, the reduced distance (d') provides for improved transistor symmetry between the source and drain regions of single transistors. Additionally, the reduced distance (d') provides for improved transistor symmetry between horizontal and vertical transistors in the same region on a wafer. Moreover, it provides for reduced lot-to-lot variations.

Figure 6:
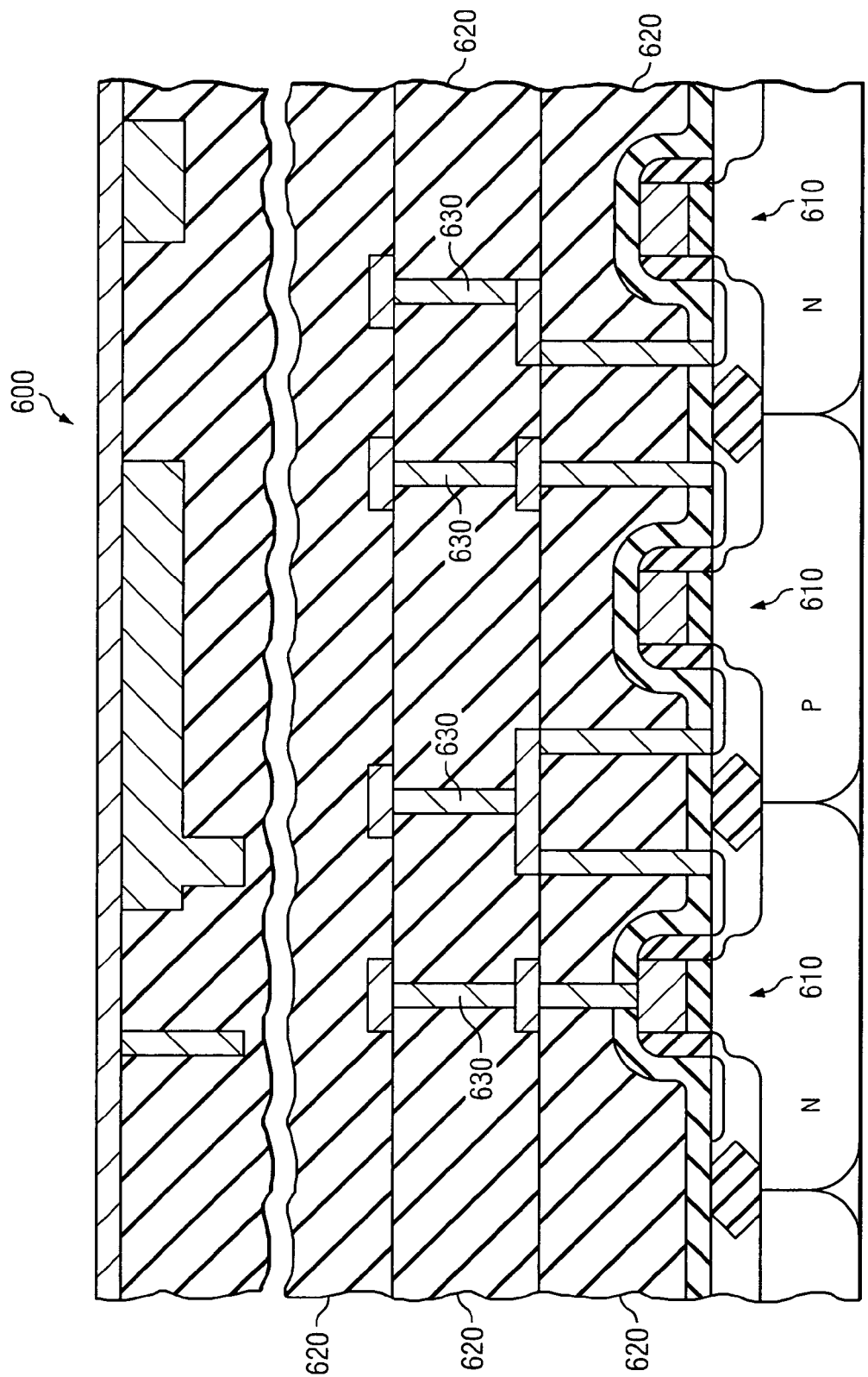
FIG. 6 illustrates a cross-sectional view of a conventional integrated circuit (IC) incorporating transistor devices constructed according to the principles of the present invention.

Referring finally to FIG. 6, illustrated is a cross-sectional view of a conventional integrated circuit (IC) 600 incorporating transistor devices 610 constructed according to the principles of the present invention. The IC 600 may include devices, such as transistors used to form CMOS devices, BiCMOS devices, Bipolar devices, or other types of devices. The IC 600 may further include passive devices, such as inductors or resistors, or it may also include optical devices or optoelectronic devices. Those skilled in the art are familiar with these various types of devices and their manufacture. In the particular embodiment illustrated in FIG. 6, the IC 600 includes transistor devices 610 having dielectric layers 620 located thereover. Additionally, interconnect structures 630 are located within the dielectric layers 620 to interconnect various devices, thus, forming the operational integrated circuit 600.

Although the present invention has been described in detail, those skilled in the art should understand that they can make various changes, substitutions and alterations herein without departing from the spirit and scope of the invention in its broadest form.

What is claimed is:

1. A method for implanting ions in a substrate, comprising:
    placing a substrate on an implant platen such that a predominant axes of the substrate is rotated about 30 degrees to about 60 degrees or about 120 degrees to about 150 degrees offset from a radial with respect to the implant platen, and further wherein the substrate is not tilted; and
    implanting ions into the substrate, the rotated position of the predominant axes reducing shadowing.

2. The method as recited in claim 1 wherein the predominant axes is rotated about 45 degrees or about 135 degrees offset from a radial with respect to the implant platen.

3. The method as recited in claim 1 wherein the substrate includes an alignment line that is aligned with the predominant axes of the substrate and therefore offset from a radial with respect to the implant platen.

4. The method as recited in claim 1 wherein the substrate includes an alignment line that is radial with respect to the platen.

5. The method as recited in claim 1 wherein the placing includes placing the substrate on the implant platen a first time and implanting about ¼ of a desired amount of ions into the substrate, the method further including:
    rotating the substrate in a direction by about 90 degrees to a second position and implanting about another ¼ of the desired amount of ions into the substrate;
    rotating the substrate located in the second position in the direction by about 90 degrees to a third position and implanting about another ¼ of the desired amount of ions into the substrate; and
    rotating the substrate located in the third position in the direction by about 90 degrees to a fourth position and implanting a remaining amount of ions into the substrate.

6. The method as recited in claim 5 wherein the direction is clockwise.

7. The method as recited in claim 1 wherein the substrate has two predominant axes that are orthogonal with respect to one another.

8. The method as recited in claim 1 wherein the predominant axes are defined by streets in the substrate.

9. The method as recited in claim 1 wherein the predominant axes are defined by features on or in the substrate.

10. The method as recited in claim 1 wherein implanting ions includes implanting ions proximate a gate structure, the rotated position of the predominant axes reducing gate structure shadowing.

11. The method as recited in claim 1 wherein implanting ions includes implanting ions using a low energy beam of charged particles.

12. A method for manufacturing an integrated circuit, comprising:
    placing a substrate having microelectronic device features on an implant platen such that a predominant axes of the substrate is rotated about 30 degrees to about 60 degrees or about 120 degrees to about 150 degrees offset from a radial with respect to the implant platen, and further wherein the substrate is not tilted; and
    implanting ions into the substrate proximate the microelectronic device features, the rotated position of the predominant axes reducing shadowing; and
    forming interconnects within dielectric layers located over the microelectronic device features to form an operational integrated circuit.

13. The method as recited in claim 12 wherein the predominant axes is rotated about 45 degrees or about 135 degrees offset from a radial with respect to the implant platen.

14. The method as recited in claim 12 wherein the substrate includes an alignment line that is aligned with the predominant axes of the substrate and therefore offset from a radial with respect to the implant platen.

15. The method as recited in claim 12 wherein the substrate includes an alignment line that is radial with respect to the platen.

16. The method as recited in claim 12 wherein the placing includes placing the substrate on the implant platen a first time and implanting about ¼ of a desired amount of ions into the substrate, the method further including:
    rotating the substrate in a direction by about 90 degrees to a second position and implanting about another ¼ of the desired amount of ions into the substrate;
    rotating the substrate located in the second position in the direction by about 90 degrees to a third position and implanting about another ¼ of the desired amount of ions into the substrate; and rotating the substrate located in the third position in the direction by about 90 degrees to a fourth position and implanting a remaining amount of ions into the substrate.

17. The method as recited in claim 16 wherein the direction is clockwise.

18. The method as recited in claim 12 wherein the substrate has two predominant axes that are orthogonal with respect to one another.

19. The method as recited in claim 12 wherein the predominant axes are defined by streets in the substrate.

20. The method as recited in claim 12 wherein the predominant axes are defined by features on or in the substrate.

21. The method as recited in claim 12 wherein implanting ions includes implanting ions proximate a gate structure, the rotated position of the predominant axes reducing gate structure shadowing.

22. The method as recited in claim 12 wherein implanting ions includes implanting ions using a low energy beam of charged particles.

* * * * *